United States Patent [19]

Camahort

[11] 4,031,851

[45] June 18, 1977

[54] APPARATUS FOR PRODUCING IMPROVED HIGH STRENGTH FILAMENTS

[76] Inventor: Jose L. Camahort, 10 Fernwood Rd., Acton, Mass. 01720

[22] Filed: Apr. 18, 1974

[21] Appl. No.: 462,073

Related U.S. Application Data

[63] Continuation-in-part of Ser. No. 386,691, Aug. 8, 1973, abandoned.

[52] U.S. Cl. .............................. 118/49.1; 118/49.5; 148/154; 277/135; 427/251
[51] Int. Cl.² .......................................... C23C 13/02
[58] Field of Search ................ 118/620, 49.1, 49.5, 118/48, 49, 50.1, 50; 117/107.1; 219/10.47; 13/31; 148/154; 277/135; 432/242; 266/3 R

[56] References Cited

UNITED STATES PATENTS

| | | | |
|---|---|---|---|
| 2,859,130 | 11/1958 | Toulmin, Jr. | 118/79.1 X |
| 2,877,138 | 3/1959 | Vodonik | 118/49.1 X |
| 3,038,731 | 6/1962 | Milleron | 277/135 X |
| 3,163,566 | 12/1964 | Jenkins et al. | 148/154 X |
| 3,206,325 | 9/1965 | Averbach | 118/49.5 X |
| 3,235,416 | 2/1966 | Jenkins | 148/154 X |
| 3,496,033 | 2/1970 | Gilbreath, Jr. et al. | 266/3 R X |
| 3,598,084 | 8/1971 | Whittier et al. | 118/49.5 |
| 3,647,530 | 3/1972 | Dyer | 118/49.5 X |
| 3,683,846 | 8/1972 | Flourney et al. | 118/49.5 X |

*Primary Examiner*—Mervin Stein
*Attorney, Agent, or Firm*—David E. Brook

[57] ABSTRACT

Fabrication apparatus is described for improving the ultimate strength of boron and other high strength filaments. In the apparatus, a gradual cooling zone is placed at the exit end of the reaction zone to prevent the sudden thermal shock normally encountered when hot boron filaments exit into the ambient atmosphere. A preheating zone can be added prior to the entrance into the reaction zone if desired. Additionally, the entrance and exit ends of the reaction zone are sealed with a molten metal, such as tin, heated to elevated temperatures close to the reaction temperature. These molten metal electrodes tend to minimize deposition of weak boron due to a low temperature region immediately following the reactor entrance and help to eliminate sudden thermal shocks to the filaments at the exit.

6 Claims, 2 Drawing Figures

APPARATUS FOR PRODUCING IMPROVED HIGH STRENGTH FILAMENTS

CROSS REFERENCE TO RELATED APPLICATIONS

This is a continuation-in-part of my earlier application, Ser. No. 386,691, filed Aug. 8, 1973, now abandoned.

BACKGROUND OF THE INVENTION

1. Field of the Invention

This invention relates to high strength, high modulus filaments.

2. Description of the Prior Art

Composite materials have been fabricated which have outstanding strength to density ratios. Typically, these composite materials comprise a high strength, high modulus filament in a plastic or metal matrix. The most widely accepted filaments to date are formed from boron.

Boron filaments are currently manufactured by a chemical vapor deposition process. A small diameter tungsten wire is passed through a reactor containing a gaseous mixture of boron trichloride and hydrogen. To provide the reaction temperatures required, the tungsten wire is resistively heated to high temperatures, typically about 1000° to 1300° C. At these temperatures, boron trichloride is reduced by hydrogen gas and deposits boron onto the tungsten filament to produce a continuous monofilament which exits from the reactor into the ambient atmosphere where it is wound onto spools. Usually, both ends of the reactor are sealed with mercury containing capillaries.

Boron filaments produced by the above method typically have average strengths of about 450,000 p.s.i., an elastic modulus of 60,000,000 p.s.i. and a density of 0.095 pounds per cubic inch. While these materials are relatively strong compared to other available materials, they have only a fraction of the theoretical strength obtainable with the boron. For example, the flexural strength of these filaments is typically about 2,000,000 p.s.i., which suggests that a theoretical tensile strength ought to be achievable of approximately 1.4 million p.s.i. for boron filaments. This has been corroborated by researchers who have measured actual tensile strength in excess of 1,000,000 p.s.i. for coreless boron obtained by longitudinally splitting commercial filaments and chemically etching the tungsten boride core. See Wawner and Satterfield, Appl. Phys. Lett., 11, No. 6, p. 192 (Sept. 15, 1967).

Despite many years of extensive research to raise the strength of boron fibers to values more closely approaching their theoretical limits, a significant gap still exists. Weak areas caused by either low temperature boron deposition or internal stress buildup are still prevalent. Thus, there is a need for boron filament fabrication apparatus and techniques which would eliminate these problems and produce higher strength filaments.

SUMMARY OF THE INVENTION

The invention relates to an improvement in the fabrication apparatus and processes for boron or other high strength filaments. In its broadest aspect, the invention comprises the elimination or substantial diminishment of the buildup of internal stresses which usually occurs during boron filament fabrication.

This is achieved, for example, by modifying currently used reactors. Firstly, the mercury entrance and exit seals can be replaced with an inert, low melting, high boiling metal seal, such as tin. Seals formed from tin and other similar metals can be heated to elevated temperatures close to the reaction temperature to minimize low temperature deposition of weak boron at the reactor entrance and to eliminate the thermal shock which occurs when the hot boron filament enters the cold mercury exit seal presently used in conventional apparatus. Mercury seals cannot be heated to the required temperatures because of mercury's relatively high vapor pressure. The use of such seals is a particular advantage in multistage reactors used to achieve high speed production of filaments without strength degradation associated with mercury seals.

Additionally, a gradual cooling zone is added to the exit side of the reactor so that the hot boron filament does not exit into cold ambient conditions. Without the cooling zone, of course, tremendous internal stresses can be built up due to the differences in the coefficients of thermal expansion of the boron and tungsten metals which are in contact at extremely elevated temperatures prior to exit from the reactor. It is believed that such buildups of internal stresses can substantially diminish the ultimate strength obtainable in such elements.

In reactors wherein an existing boron filament is coated with an outer protective film, such as silicon carbide, a gradual heating zone can be provided before the reactor and a gradual cooling zone can be provided after the reactor. This tends to reduce the buildup of internal stresses at both the entrance and exit of a reactor.

Although prior attempts have been made to anneal high strength filaments after their production, no attempts have been made to eliminate or substantially diminish the buildup of stress during fiber production. Such annealing techniques have resulted in only slight improvements in ultimate tensile strengths.

SUMMARY OF PREFERRED EMBODIMENTS

Figure 1:
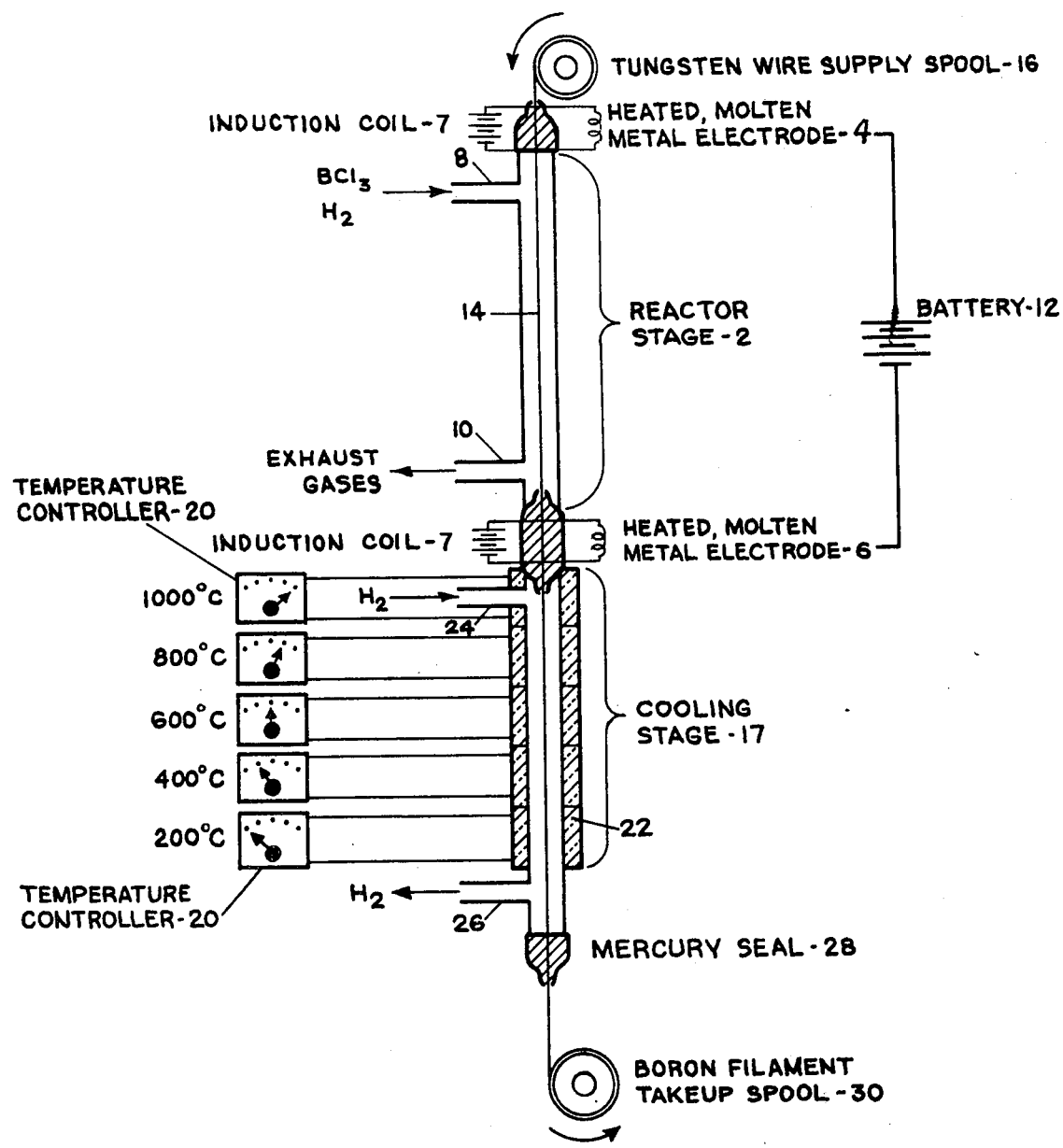
FIG. 1 illustrates schematically a reactor and gradual cooling zone suitable for fabricating boron filaments with improved ultimate tensile strengths.

Referring now to the Figures in more detail, FIG. 1 illustrates vapor deposition apparatus suitable for forming high strength boron filaments as described herein. A reactor stage 2, which may be formed from glass, for example, is sealed at its upper end by molten metal electrode 4 and at its lower end by molten metal electrode 6. The molten metal electrodes can be formed from a capillary filled with a suitable molten metal. Molten metal electrodes 4 and 6 are heated by induction coils 7. Sufficient heat should be supplied to heat the molten metal to temperatures of about 1000° to 1300° C., which is the usual boron deposition temperature range.

Reactant inlet 8 is provided for the introduction of boron trichloride and hydrogen gases, and outlet 10 provides a means for exhaust gases to escape from the reactor stage 2. Battery 12 applies a DC potential across molten metal electrodes 4 and 6. Tungsten wire 14, typically about 0.5 mils in diameter, is supplied by spool 16 to reactor stage 2 through molten metal electrode 4. Tungsten wire 14 is resistively heated to temperature at which the hydrogen gas reduces the boron trichloride and deposits boron thereon by passing sufficient current through wire 14.

Cooling stage 17 is illustrated as being divided into five separate temperature zones, each having its own temperature control means 20. Temperature control means 20 is connected to suitable heating means, such as resistance heaters 22, which surround the various insulated zones of cooling stage 17. A gas which does not react with the boron surface, such as hydrogen, is fed to cooling stage 17 through inlet 24 and exits through outlet 26. Hydrogen is a preferred cooling gas because it contains no appreciable oxygen impurities and because it is inert to boron at the cooling zone temperatures. Other suitable gases include argon, helium, neon and nitrogen. Cooled boron filament 14 exits from cooling stage 17 through a mercury seal 28 and is eventually taken up by spool 30. Mercury seal 28 can be replaced with an open capillary or other suitable seal if a non-flammable gas such as nitrogen is substituted for hydrogen in cooling stage 17.

With this apparatus, boron filament enters cooling stage 17 at a temperature approximately equal to the temperature it achieves in reactor stage 2. As it travels through cooling stage 17, it is gradually cooled to a much lower temperature before it exits into the relatively cold ambient atmosphere. Thus, the introduction of internal stresses caused by differences in the coefficients of thermal expansion of tungsten wire and boron metal are substantially diminished.

As has been stated above, prior boron filament reactors typically use mercury seals at their entrance and exit. Mercury is not sufficient for heated molten metal electrodes 4 and 6, however, since it would volatilize at the elevated temperatures required. Suitable metals must have a low vapor pressure and good electrical conductivity at the reaction temperature. Preferably, the metals are also low melting, i.e. have melting points less than about 700° C. For boron filament fabrication, the molten metal should have a vapor pressure of below about 20 millimeters of mercury, and preferably less than about 1 millimeter, and a resistivity of less than about 100 microhm-cm. at 1000° C. Although not always essential, it often is advantageous for the molten metal to be inert to the filament material, reaction and inert gases at the reaction temperatures.

Tin is a preferred metal for use in the molten metal electrode because of its low melting point (232° C.), low vapor pressure at the reaction temperatures (1 mm. at 1492° C.), excellent conductivity, and its inertness to boron and the various gases present in boron filament reactors. Other suitable metals include lead, bismuth, antimony, thallium, and many of their alloys.

Figure 2:
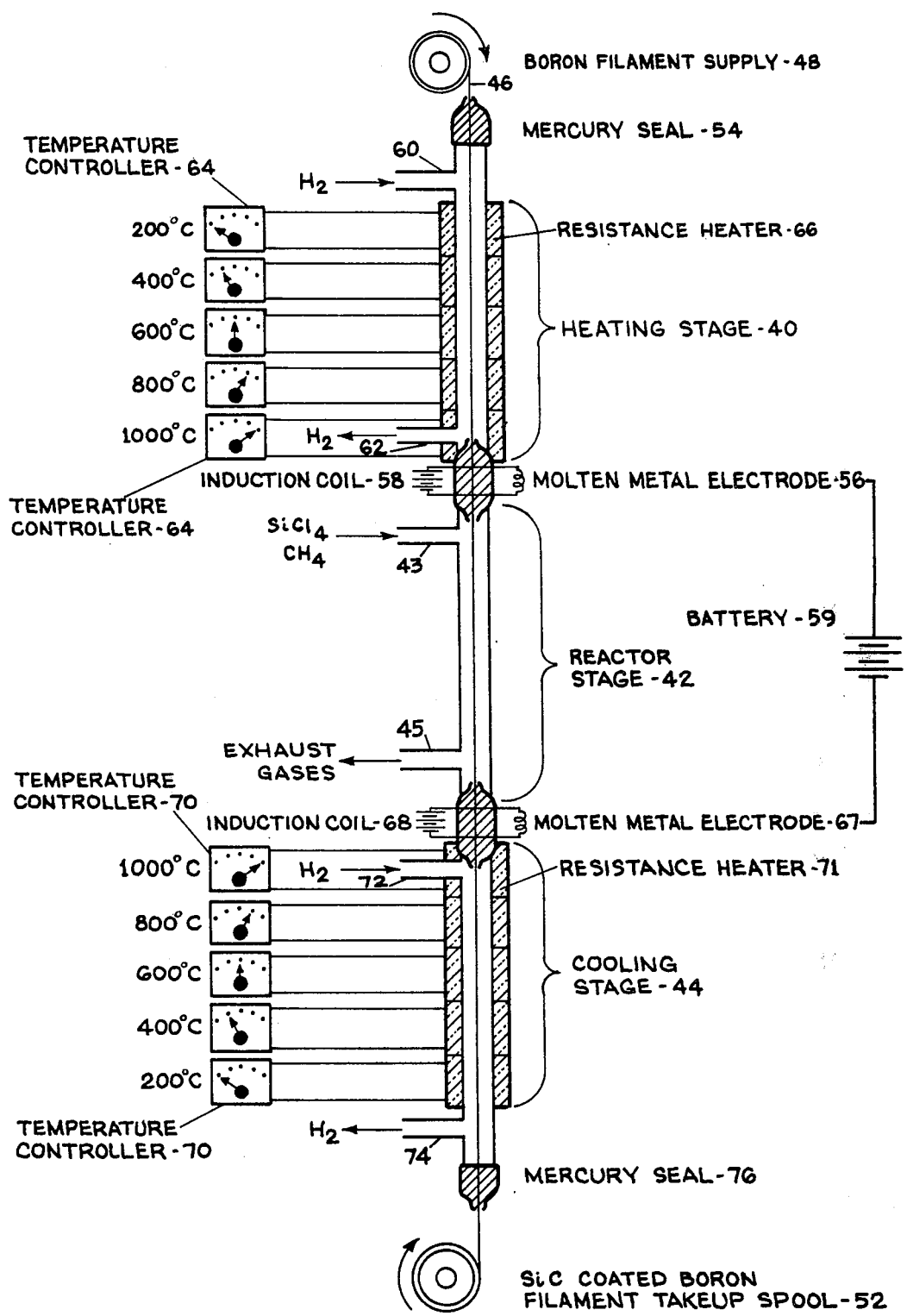
FIG. 2 illustrates schematically a reactor, gradual preheating stage, and gradual cooling stage which are suitable for coating boron filaments with silicone carbide to produce composite fibers of improved uiltimate tensile strengths.

FIG. 2 illustrates a suitable reactor for coating boron filaments with a material such as silicon carbide. The apparatus illustrated comprises three stages, a heating stage 40, reactor stage 42 and cooling stage 44. Boron filament 46 is supplied to the apparatus by supply roll 48. It is coated in the reactor stage 42 with silicon carbide, and the coated boron filament 50 is eventually taken up by spool 52. Of course, the boron filament could be formed in a first stage and then coated with silicon carbide in a second stage in one continuous operation. Heating stage 40 can be formed from glass and can be sealed at its upper end with a mercury seal 54 and at its lower end with a molten metal electrode 56. The molten metal electrode 56 has the same properties as that described in regard to FIG. 1. It is also heated by induction coils 58 to temperatures near those in the reaction zone. Hydrogen enters heating stage 40 at inlet 60 and exits from outlet 62.

Heating stage 40 is gradually heated by temperature controllers 64 which are connected to resistance heaters 66 placed around the glass heating stage. The temperature is gradually increased by controllers 64 as the boron filament 46 proceeds towards the reactor stage 42. As filament 46 enters the reactor stage 42 through molten metal electrode 56, it should be at a temperature close to that required for vapor deposition in the reactor stage 42.

Reactor stage 42 can also be formed from glass, and in fact can be a continuation of the preheating zone 40. Reactor 42 is sealed at its upper and lower portion by molten metal electrodes 56 and 67, respectively. The metals forming electrodes 56 and 67 can be the same or different, but in general should have the properties required of the metal electrode described in relation to FIG. 1. Molten metal electrode 67, at the exit of reactor stage 42, is heated by induction coils 68 to a temperature close to that encountered in reactor stage 42. As shown, silicon tetrachloride or silanes and methane are introduced at gas inlet 43 to deposit silicon carbide on the boron filament 46. Waste gases are exhausted through exit 45.

Cooling stage 44 is provided to gradually decrease the temperature of the silicon carbide coated boron monofilament. Thus, temperature controllers 70 gradually decrease the temperature in the cooling stage 44 by controlling the temperatures of resistance heaters 71. A gas inert to the silicon carbide coated boron monofilaments, such as hydrogen, is introduced through inlet 72 and exits through outlet 74. The lower end of the cooling stage is sealed by a mercury seal 76 formed from a capillary containing mercury.

The advantage of the apparatus illustrated in FIG. 2 is that it substantially eliminates the buildup of internal stresses in the composite fibers at both ends of the reaction zone. Thus, at the entrance end, internal stresses which might be built because of rapid heating of the boron filament which has a tungsten core are eliminated. At the exit zone, the cooling zone prevents stress buildup due to rapid cooling of the silicon carbide coated boron filament.

Those skilled in the art will recognize many equivalents which are intended to be covered by the appended claims. For example, the procedure and apparatus as illustrated herein have been specifically directed to boron monofilaments deposited on tungsten cores. Nevertheless, many materials could be used other than those specifically mentioned. For example, titanium, carbon or steel cores could be used instead of tungsten. Likewise, sheath materials formed from boron carbide, silicon carbide, titanium diboride, etc. could be used in place of the boron. Protective films such as boron carbide, titanium diboride, boron nitride, etc. could also be used. Additionally, the high strength filaments could be contained in metal matrices such as aluminum or titanium, or in plastic matrices such as those formed from epoxy resins, polyamides, etc. It will be recognized that the more materials, and the more dissimilar the coefficients of expansions of these materials, the more need there is to use the procedure and apparatus described herein.

Additionally, the apparatus and technique described herein have been illustrated for use during fabrication of fibers. It is equally applicable, however, to anneal existing high strength filaments which have previously been fabricated by prior art techniques. Thus, existing composite fibers can be passed through preheating and cooling zones as described herein, and selectively heated above the annealing point in an inert atmosphere such as hydrogen by resistance or radio frequency heating, etc. to anneal these filaments.

What is claimed is:

1. A vapor deposition apparatus for forming composite, high strength filaments having a core material and a sheath material, comprising:
   a. a reactor, including:
      1. a reaction zone;
      2. means for directing said core material through said reaction zone;
      3. means to seal said reaction zone at its entrance end;
      4. means to seal said reaction zone at its exit end, said means to seal comprising an inert, low-melting, high-boiling metal;
      5. means to introduce a gaseous source of sheath material of boron to said reaction zone;
      6. means to exhaust reaction gases from said reaction zone;
      7. means to selectively heat said core to a temperature at least equal to the temperature at which the sheath material deposits onto the core material.
   b. means for controllably cooling said composite material after it exits from the reactor and before it enters the ambient atmosphere to prevent buildup of internal stresses in said composite filament which substantially diminish its strength.

2. The vapor deposition apparatus of claim 1 wherein said means to seal said reaction zone at its exit end comprises a molten metal seal wherein the metal is selected from tin, lead, bismuth, antimony and thallium.

3. The vapor deposition apparatus of claim 2 wherein said means for directing core material includes means to pass tungsten or carbon monofilament through said reaction zone.

4. The vapor deposition apparatus of claim 3 wherein said means to seal said reaction zone at its entrance end comprises a molten metal seal wherein the metal is selected from tin, lead, bismuth, antimony and thallium.

5. The vapor deposition apparatus of claim 4 wherein said gaseous source of boron comprises boron trichloride.

6. The vapor deposition apparatus of claim 2 additionally including a preheating zone for gradually heating filament material prior to its entrance into the reaction zone.

* * * * *